(12) United States Patent
Maeda et al.

(10) Patent No.: US 6,241,145 B1
(45) Date of Patent: Jun. 5, 2001

(54) LEAD-FREE SOLDER JOINING METHOD AND ELECTRONIC MODULE MANUFACTURED BY USING THE METHOD

(75) Inventors: Akira Maeda; Takuo Ozawa; Toshio Umemura, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/553,770

(22) Filed: Apr. 21, 2000

(30) Foreign Application Priority Data

Apr. 22, 1999 (JP) .................................................. 11-114995

(51) Int. Cl.[7] ............................. B23K 31/02; B23K 35/22
(52) U.S. Cl. ...................... 228/180.22; 228/195; 228/197
(58) Field of Search ......................... 228/180.22, 195, 228/254, 197, 248.1, 56.3; 428/403, 209; 166/286.2, 287.19

(56) References Cited

U.S. PATENT DOCUMENTS

| | | | |
|---|---|---|---|
| 5,221,038 | * | 6/1993 | Melton et al. . |
| 5,229,070 | * | 7/1993 | Melton et al. . |
| 5,269,453 | * | 12/1993 | Melton et al. . |
| 5,372,295 | | 12/1994 | Abe et al. . |
| 5,535,509 | | 7/1996 | Tomita et al. . |
| 5,609,287 | | 3/1997 | Izuta et al. . |
| 5,928,404 | * | 7/1999 | Paruchuri et al. . |

FOREIGN PATENT DOCUMENTS

| | | |
|---|---|---|
| 61-22878 | 6/1986 | (JP) . |
| 10-41621 | 2/1998 | (JP) . |

* cited by examiner

Primary Examiner—Tom Dunn
Assistant Examiner—Jonathan Johnson
(74) Attorney, Agent, or Firm—Leydig, Voit & Mayer, Ltd.

(57) ABSTRACT

A joining method using lead-free solder which can produce a good joint through a heating process. A first lead-free alloy layer is formed on surfaces of all parts to be mounted on a board at a temperature equal to or lower than the melting point of the first alloy layer. A second lead-free alloy layer having a melting point lower than the first alloy layer is formed on surface of the board. The first and second alloy layers are placed in contact with each other and heated to a predetermined temperature.

5 Claims, 3 Drawing Sheets

LEAD-FREE SOLDER JOINING METHOD AND ELECTRONIC MODULE MANUFACTURED BY USING THE METHOD

BACKGROUND OF THE INVENTION

1. Field of the Invention

The present invention relates to a solder-packaging method for an electronic device, and an electronic module manufactured by using the method.

2. Description of the Related Art

Conventionally, Sn—Pb based solder is employed for joining an electronic device by using solder. In particular, in order to reduce the temperature load of the parts, solder having composition near 63Sn—37Pb and a melting point of about 183° C. (hereinafter merely called eutectic solder) has been widely used. The terminals (leads) or the electrodes of the electronic parts etc. are joined to the Cu electrode pads on the circuit board of a printed circuit etc by using such solder and heating to about 220° C.

On the other hand, in recent years, in a view point of the environmental pollution, such a tendency of restricting the usage of lead (Pb) contained in solder for an electronic device has been active. Thus, solder not containing Pb, that is, so-called "Pb-free solder" has been developed and the application thereof has been popularly investigated.

The Pb-free solder alloy having been developed is formed in a manner that a small amount of third and fourth elements such as Cu, Bi, In etc are added to the Sn-type eutectic solder based alloy including Sn—58Bi (melting point; 139° C.), Sn—3.5Ag (melting point: 221° C.), Sn—9Zn (melting point: 197° C.) etc., in order to adjust the melting point and improve the mechanical property thereof. However, such Pb-free solder alloys have both a good point and a bad point in the joining reliability (wettability, heat-resistant fatigue etc.), working temperature (melting point), stability of supply, cost etc., so that it is difficult under the existing circumstances to employ a single Pb-free solder in place of the current eutectic solder so as to satisfy the aforesaid properties for all of the flow soldering, reflow soldering and hand soldering.

In particular, in the reflow soldering in which a large number of parts mounted on a board can not be heated partially or locally but are soldered simultaneously, since it is required to heat all the soldering portions to a predetermined temperature, there may be portions which temperature increases above the required value. Thus, there have been various restrictions in the heat-resistant temperature of the parts and the material of the solder to be used. In general, solder alloy which does not remelt at the temperature equal to or less than 150° C. is employed in view of securing the reliability with respect to the heat generated upon operation of a semiconductor element and the thermal history in the assembling process thereafter. In contrast, in view of the temperature variance at the time of mounting a large number of parts, and in order to prevent the degradation of the quality of the parts with poor heat-resistant property such as a chemical capacitor and the polymer material such as a print circuit board and to prevent the degradation of electric elements etc., it is desired to set the temperature load applied to the parts joined by the eutectic solder at about 220° C. or lower than that.

In view of the aforesaid matters, at present, Sn—9Zn based alloy having a melting point of about 187–197° C. at most has been developed as the Pb-free solder in a view point of the melting point of the alloy. Such an alloy is quite likely oxidized since Zn is very active, so that wettability can not be higher reliability under the current soldering process even if various ideas such as the heating using strong flux or within inactive atmosphere are employed. Even if higher wettability can be obtained, when the electronic device having been subjected to the solder joining is used under the usual circumstances, Zn diffuses within the solder joining portion and appears on the surface of the joining portion to form a Zn-enriched layer. When such solder is coated on a terminal thereby to cure the mold resin, a Zn-enriched layer is formed on the surface of the package terminal through the thermal history of the solder. In this case, there arises such problems that higher wettability can not be obtained due to the oxidization of the Zn-enriched layer and the stress corrosion sensibility is enhanced, so that it is difficult at the present stage to employ other solder in place of the aforesaid solder.

On the other hand, there is another type of soldering material which is formed by adding Bi, In having melting-point lowering effect to Sn—3.5Ag such soldering material has such a property that solidus curve temperature decreases but liquidus curve little decreases. Thus, in a case of joining by using such soldering material under the current soldering process, the joining process is performed in an area where both solidus and liquidus exist. That is, the joining is performed by the liquidus portion while remaining the solidus portion. Thus, in this case, a coefficient of viscosity is larger and the wettability is lower as compared with the case where the soldering is performed in a state that the entirety of the solder is in a liquidus state, so that the defective joining such as a void etc. is likely generated. When a large amount of the aforesaid elements are added, there arises a problem that the cost of the soldering material becomes expensive and the reliability of the joining process is degraded.

As described above, such a solder joining technology is desired that employs, in place of the current eutectic solder, Pb solder which can join by using the existing device and has high joining reliability.

Further, there is a module wherein Pb-free material is employed only in the soldering material and the plating process using the material containing Pb is performed for the metalization on the parts side. Such a module is not an electronic module fabricated by the Pb-free solder joining process. Thus, an electronic module fabricated by the Pb-free solder joining process in the true meaning is desired.

In the aforesaid soldering technology for an electronic device etc., it is desirable that a large number of parts can be soldered simultaneously. Further, it is desirable that the joining temperature at the soldering process is low in view of the joining reliability and it is also necessary the solder does not remelt by the heat generated upon operation of electric elements.

However, the aforesaid prior art has the following problems.

Each of the Sn—Ag type alloy and the alloy formed by adding Bi, In etc. thereto has a melting point of 221° C. which is higher than the melting point of the current Sn—Pb eutectic solder by 40° C., so that it is impossible to perform the joining process under the current joining temperature at the soldering process. Thus, in a case of performing the soldering by using such alloy as the soldering material, the soldering is required to be performed after removing parts with a low heat-resistant temperature and the parts thus removed are joined thereafter, so that the soldering cost becomes expensive. Further, since the peak temperature of the heating process etc. is made high, polymer material such as the electric elements, resin etc. is likely deteriorated heavily and the parts are likely subjected to oxidization etc. heavily, whereby it is feared that defective soldering may be caused. Furthermore, in the area where both solidus and liquidus exist, although the solder is in a semi-melting state, all the solder is not in the liquidus state, so that it is feared that high wettability may not be obtained. In particular, it is feared that the defective joining such as a void etc. may be generated for the soldering portion subjected to the surface processing using Ni etc. having poor wettability.

Each of the Sn—Bi type alloy and the alloy formed by adding some kinds of elements thereto has a melting point of 139° C. which is lower than the melting point of the eutectic solder by 50° C., so that such alloy may remelt by the heat generated upon the operation of an electric element thereby to degrade the joining reliability. Further, the joining reliability may also be degraded due to the fragility of Bi much contained in the alloy.

Each of the Sn—Zn type alloy and the alloy formed by adding small amount of Bi, In etc. thereto having a melting point closest to that of the eutectic solder is oxidized heavily under a particular circumference such as the heating using strong flux or within inactive atmosphere, so that it is difficult to obtain high wettability and so it is feared that the joining reliability is degraded.

As described above, it is impossible at present to employ alloy made of single composition in place of the eutectic solder.

In order to solve the aforesaid problems, for example, JP-A-10-41621 discloses, as a method of improving the solder joining reliability of Sn—Bi type alloy, a method of supplying Sn—Bi alloy to a part side, supplying an Ag additive film to a circuit board side and diffusing Ag into a Sn—Bi solder layer upon soldering. However, since the Sn—Bi is heated to a temperature higher than the melting point thereof and joined, the constituent metal or metalized material diffuses within the solder layer from the part side in a short time thereby to accelerate the growth of the intermetallic compound. As a result, it is feared that the joining reliability is degraded due to the growth of the intermetallic compound.

Further, in view of the fact that the composition of the Ag additive layer is not disclosed clearly and the melting point of Ag is 962° C., it is feared that the temperature etc. for obtaining good joining state with the Sn—Bi alloy having a melting point around 139° C. varies largely, whereby such solder is disadvantageously insufficient to be used generally in place of the existing eutectic solder. Furthermore, since the main alloy is formed by the Sn—Bi alloy, the remelting temperature of the alloy does not increase largely even if a small amount of Ag is diffused therein, so that it is feared that such alloy may remelt around 139° C. Thus, in order to diffuse a large amount of Ag, it is required to make the heating temperature higher or to make the heating time longer. In this case, it is feared that the cost of such solder is raised due to the increase of Ag.

On the other hand, as a method of forming a mixed integrated circuit module, for example, JP-A-55-14941 discloses such a method of supplying high melting point solder to some of IC chips, supplying low melting point solder to a board side in opposite thereto and to a non-IC chip, heating at such a temperature range that the lower melting point solder melts but the higher melting point solder does not melt, thereby to perform melting joining in a collective reflow manner without degrading IC elements. This method is a technique particularly being conscious of Sn—Pb alloy which melting temperature can be designed easily. In the Pb-free solder, since some of non-IC chips is joined by lower melting point alloy, for example, Sn—58Bi, it is feared as described above that defective remelting due to the heat generated upon operation of the element may be caused and the joining reliability may be degraded due to the excessive Bi as compared with the existing alloy.

SUMMARY OF THE INVENTION

Accordingly, the invention has been made in view of the aforesaid problems of the prior art, and an object of the invention is to provide a joining method using Pb-free solder which can obtain high wettability through a heating process substantially same as the existing Sn—Pb eutectic solder and an electronic module fabricated by using the method.

The joining method using Pb-free solder according to a first aspect of the invention is arranged in a manner that a solder joining method for mounting electronic parts on a board comprising the steps of:

forming a first alloy layer containing no Pb on the electronic parts at a temperature lower than a melting point of the first alloy layer;

forming, on a surface of the board on which the electronic board is mounted, a second alloy layer which contains no Pb and has a melting point lower than the melting point of the first alloy layer;

contacting the first alloy layer to the second alloy layer to each other; and heating the first and second alloy layers at the higher temperature than the melting point of the second alloy layer and lower than the melting point of the first alloy layer thereby to join the electronic parts on the board.

The joining method using Pb-free solder according to a second aspect of the invention is arranged, in the arrangement of the first aspect, in a manner that the first alloy layer remains at a joining portion of the first and second alloy layers after the contacting and heating steps.

The joining method using Pb-free solder according to a third aspect of the invention is arranged, in the arrangement of the first aspect, in a manner that the first alloy layer contains Sn as a main component thereof and at least Ag, and the second alloy layer contains Sn as a main component thereof and at least Bi.

The electronic module according to a fourth aspect of the invention is fabricated by the Pb-free solder joining method according to one of the first to third aspects.

DETAILED DESCRIPTION OF THE PREFERRED EMBODIMENTS

The embodiments of the invention will be explained with reference to the accompanying drawings.

First Embodiment

Figure 1:
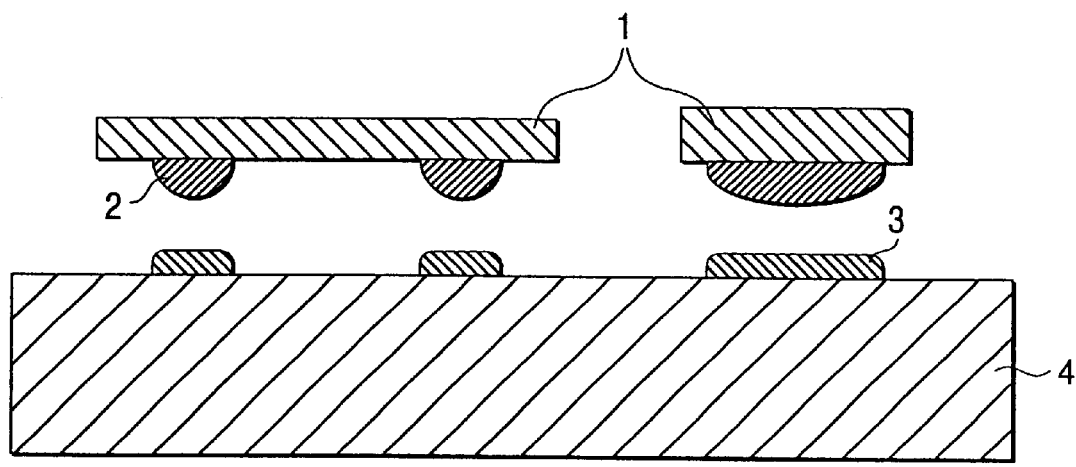
FIG. 1 is a diagram used for explaining the principle of the first embodiment of the invention.

FIG. 1 is a diagram used for explaining the principle of the invention. In the figure, a reference numeral 1 depicts electronic parts on which first alloy layers 2 are formed and 4 depicts a board on which second alloy layers 3 are formed (here, the board means a board on which a plurality of electronic parts are mounted). The electronic parts 1 are mounted on the board 4 by means of soldering. The first alloy layers 2 has a melting point higher than that of the second alloy layers 3. Each of the first and second alloy layers is an alloy layer containing no Pb.

The first alloy layers 2 and the second alloy layers 3 are made contact to each other and heated at a temperature in a range equal to or higher than the melting point of the first alloy layers 2 and equal to or lower than the melting paint of the second alloy layers 3 thereby to obtain a proper joining portion. Although the first alloy layers 2 do not melt immediately after the heating, the second alloy layers 3 melt as the heating time becomes longer and the first alloy layers 2 also melt gradually as the melted second alloy layers diffuse.

The first and second alloy layers are formed for example by chemical deposition such as plating etc., PVD method etc. such as vacuum evaporation, sputtering or the like. Since the first alloy layers 2 are formed on the electronic parts, it is feared that the layers damage the electronic parts when the temperature upon forming the first alloy layers is high, it is desirable to form the first alloy layers on the electronic parts 1 at the temperature lower than the melting point of the alloy constituting the alloy layers.

Further, it is desirable to adjust feeding amounts, sizes and shapes of the first alloy layers 2 and the second alloy layers 3 in accordance with the sizes, mass, patterns etc. of the portions to be joined. Thus, it will be easily understood that the following effects can be obtained: the decrease in the amount of the solder due to the pumping-up can be prevented, the sizes and the shapes of the solder joining portion can be controlled, and the short-circuit between the adjacent solder can be prevented.

As described above, the first alloy layers and the second alloy layers each containing no lead are formed on the electronic parts and the board on which the electronic parts are mounted, respectively, and the first alloy layers are formed on the electronic parts in a manner that they have the melting point higher than that of the second alloy layers on the board side and they are formed at a temperature lower than the melting point of the alloy itself formed at the time of forming the alloy layers on the electronic parts. Thus, the electronic parts can be prevented from being damaged thermally. Further, the joining temperature is set to be higher than the melting point of the second alloy layer but lower than the melting point of the first alloy layer, and the joining process is realized by using the melting diffusion of the alloy of the second alloy layers. Thus, the heating of the electronic parts can be suppressed and good joining can be obtained.

Second Embodiment

The electronic module which is formed by the solder joining method shown in the first embodiment so as to mount electronic parts such as IC chips etc. on a substrate, a board etc. employs the solder containing no lead and has good joining portions, so that the electronic module of a low cost and high reliability can be provided.

Further, since such an electronic module has the alloy layers formed on the electronic part side having the melting point higher than that on the board side, any defective portion due to the solder remelting will not be generated even if the electronic parts are heated upon operation of the electronic module, so that the reliability of the electronic module can be improved.

The specific examples will be described below.

First Example

Sn—3.5Ag (melting temperature of 221° C.) is formed as first alloy layers by the plating process at the temperature in a range of 25 to 30° C. on an Si chip of 6.4 $mm^2 \times 0.5$ mm thickness, and Sn—58Bi (wt %) (melting temperature of 139° C.) is formed as second alloy layers by the past printing process on a Cu wiring portion of 10 $mm^2 \times 0.5$ mm thickness on a board (24 $mm^2$). The solder joining is performed in a manner that the Sn—3.5Ag and the Sn—58Bi (wt %) are made contact to each other and heated by a hot plate from the board side (at the setting temperature of 190° C. for about 40 sec). The total thickness of the first and second alloy layers is about 200 $\mu$m. When the module formed in this manner was subjected to the experiment under the same condition (tensile force) as the module formed by the existing Sn—Pb eutectic solder, it was proved that the example of the invention can obtain the rupture strength larger than the conventional example.

Figure 2:
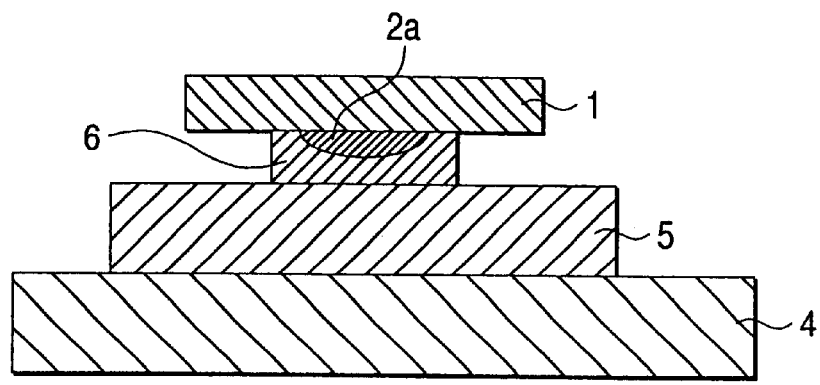
FIG. 2 is a schematic diagram showing the sectional configuration of the solder joining port on in the first example of the invention.

FIG. 2 is a sectional schematic diagram of the solder joining portion in the example of the invention. In the figure, a reference numeral 5 depicts wiring formed on the board and 6 depicts an alloy layer formed by joining the first and second alloy layers by the contacting and heating processes. The first alloy layer remains in the alloy layer 6. Thus, in this invention, it was proved that sufficient joining strength can be obtained even if the distribution of element is not uniform at the solder joining portion. It is required to heat at the higher temperature and for a longer time in order to uniform the distribution of the composition and the elements of the solder joining portion. However, since sufficient joining reliability can be obtained even if the first alloy layer remains, if the joining condition is set so as to remain the first alloy layer, it is possible to form lead-free solder joining at a low cost at a relatively low temperature and in a relatively short time.

Second Example

Figure 3:
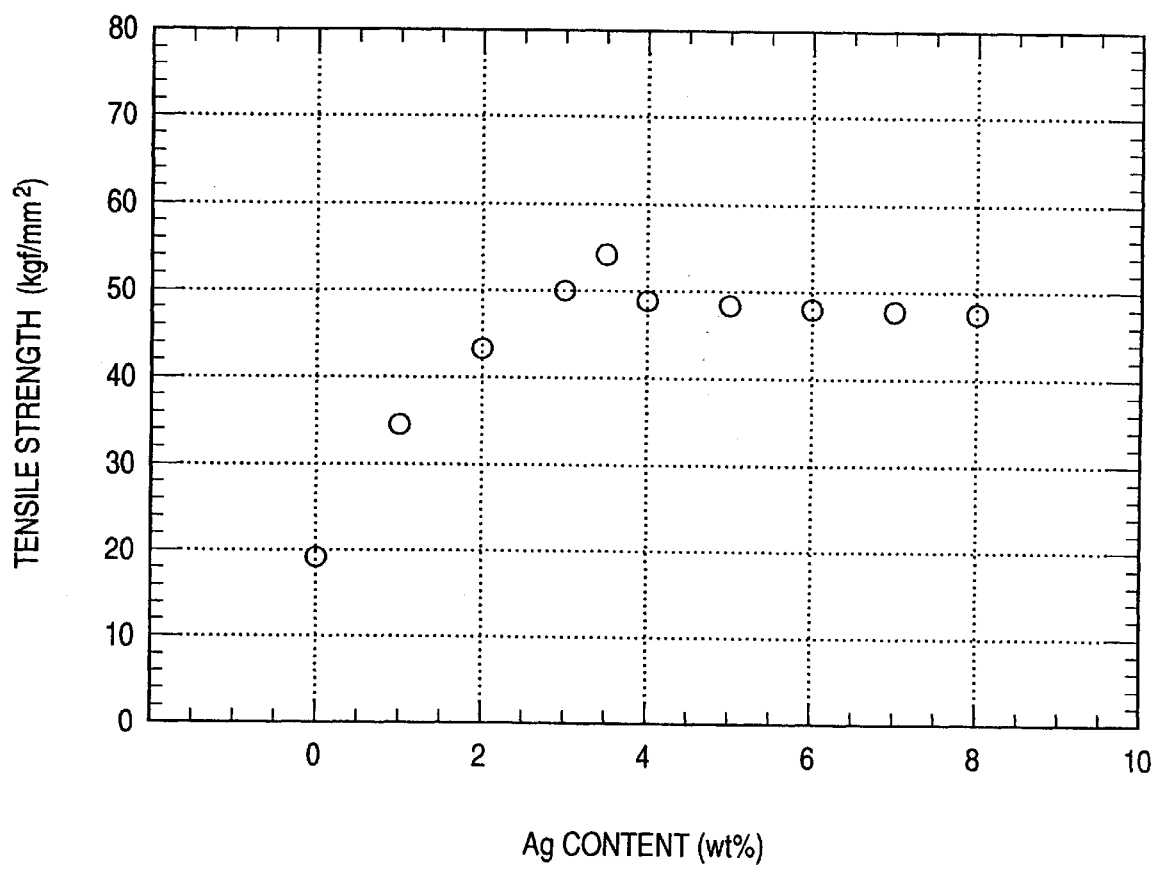
FIG. 3 is a diagram showing the relation between tensile strength and Ag content in the second example of the invention.

FIG. 3 is a diagram showing the relative result between a tensile strength and an Ag content amount which is measured in a manner that Sn—Xwt %Ag (X=0, 1, 2, 3, 3.5, 4, 5, 6, 7, 8) alloy cast so as to have a size ø12×120 mm is processed into a parallel portion with a size ø8×25 mm to form a test piece, then the test piece is aged during 20 days at the room temperature, and the test piece is subjected to the tensile experimentation at the tensile speed of 10 mm/min. In general, it has been said that the larger the tensile strength of the alloy, the alloy is more superior to the creep strength etc. and high in its joining reliability. As shown in FIG. 3, it was proved that if the Sn alloy is formed so as to include at least Ag, such alloy can obtain tensile strength which can be distinguished sufficiently from the alloy formed only by Sn. Further, it was proved that if Ag of 3.5 wt % or more is added to Sn alloy, the tensile strength of such alloy does not increase but in contrast decreases gradually. Although the decreasing rate of the tensile strength is lower when Ag of 3.5 wt % or more is added to Sn alloy, the cost of the alloy becomes expensive when a large amount of Ag is added, so that Ag of 5 wt % at most may be added. A small amount of other elements may be added to the alloy of this example as the need arises.

Figure 4:
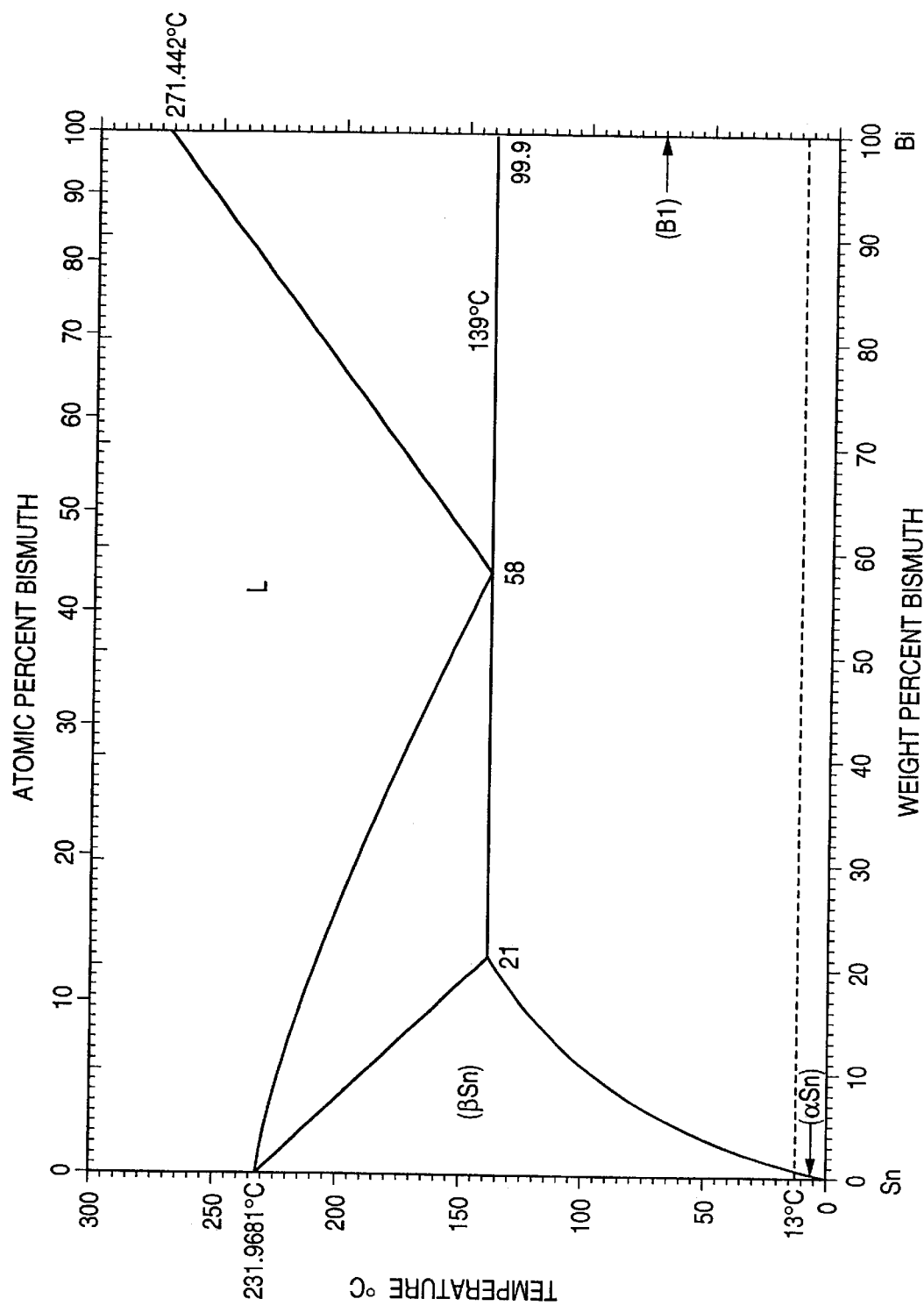
FIG. 4 is a diagram showing the state of two alloy type (Sn—Bi) in the invention.

FIG. 4 shows an Sn—Bi two-dimensional state diagram. In a case of realizing the second alloy layer by the Sn—Bi type alloy which is proposed as the lead-free solder, if Bi is added to Sn, the local Sn—Bi low-temperature phase (phase melted at 139° C.) within the alloy is softened and so the second alloy layer can be diffused and joined with the first alloy layer. Preferably, the second alloy is set so as to contain Bi of 3 wt % or more so that it has a melting point lower than the melting point 221° C. of Sn—3.5Ag. When Bi is added excessively, it is feared that the joining strength of the second alloy is reduced and the cost thereof becomes higher, so that Bi may be added to about 58 wt % which is the eutectic composition.

Although there is In etc. as the element capable of reducing the melting point of Sn, it is desirable to employ Bi in view of cost, stability of supply etc. Since each of the first and second alloy layers is formed by the alloy containing Sn as the main component thereof like the existing eutectic solder, high joining reliability can be obtained while maintaining the joining mechanism with a member etc. Further, since each of the first and second alloy layers is formed by the same element as a base element, good wetness can be obtained and good and proper joining state can also be obtained.

As described above, in the invention, the alloy containing Sn as the main component and Ag which is high in joining reliability and slightly high in the melting point than that of the existing eutectic solder is used as the first alloy layer, and the alloy containing Sn as the main component and Bi which is slightly low in the melting point than that of the existing eutectic solder is used as the second alloy layer. Thus, since the melting point of the second alloy layer is lower than that of the first alloy layer, the thermal influence on the electronic parts on which the first alloy layers are formed can be suppressed. Further, since the joining is realized by the joining mechanism using the solder containing Sn as the main component, the joining with high reliability can be realized.

Third Example

Investigation was made as to the initial joining state of the sample wherein a package and a board is joined by using the process of the invention and of the sample wherein the package and the board is joined by using the existing eutectic solder. The sample formed by the process of the invention employs, for example, Sn—3.5Ag as the first alloy layer shown in the first example and Sn—58Bi(wt %) as the second alloy layer, then the first and second alloy layers are formed on the electronic part (package) and the wiring portion on the board (substrate) and the first and second layers are joined by the solder. The sample formed by the Process of the invention maintains a proper joining state almost like the sample formed by the conventional method and is expected to have a long joining life time. Further, since the invention employs in place of the existing solder such solder that does not to contain lead which is harmful and contains much α rays but contains Sn which contains relatively small α rays as the main component, it is possible to provide a device which is friendly to or saves the environment and emits small amounts of α rays, that is, scarcely causes erroneous operation of a computer (called as software errors).

As described above, according to the joining method using Pb-free solder according to the inventions a solder joining method for mounting electronic parts on a board includes the steps of:

forming a first alloy layer containing no Pb on the electronic parts at a temperature lower than a melting point of the first alloy layer;

forming, on a surface of the board on which the electronic board is mounted, a second alloy layer which contains no lead and has a melting point lower than the melting point of the first alloy layer;

contacting the first alloy layer to the second alloy layer to each other; and heating the first and second alloy layers at the higher temperature than the melting point of the second alloy layer and lower than the melting point of the first alloy layer thereby to join the electronic parts on the board. Further, the first alloy layer remains at a joining portion of the first and second alloy layers after the contacting and heating steps. Thus, the heating of the electronic parts can be suppressed and good joining can be realized without using lead solder.

Further, the first alloy layer contains Sn as a main component thereof and at least Ag, and the second alloy layer contains Sn as a main component thereof and at least Bi. Thus, it becomes possible to design solder having a melting point lower than the conventional solder and good joining can be realized without using Pb—Sn solder.

Since the electronic module according to the invention is fabricated by the joining method using solder containing no lead, it is possible to provide an electronic module capable of securing high joining reliability like the prior art. Further, since the invention employs in place of the existing solder such solder that does not to contain Pb but contains Sn which contains relatively small α rays as the main component, it is possible to provide a device which is friendly to or saves the environment and emits small amounts of α rays, that is, scarcely causes erroneous operation of a computer (called as software error).

What is claimed is:

1. A solder joining method for mounting electronic parts on a board with a lead-free solder, the joining method comprising:

forming a first alloy layer containing no lead on an electronic part having a melting point higher than the first alloy;

forming, on a surface of a board on which said electronic part is to be mounted, a second alloy layer which contains no lead and has a melting point lower than the melting point of said first alloy layer;

contacting said first alloy layer with said second alloy layer; and heating said first and second alloy layers at a temperature higher than the melting point of said second alloy layer and lower than the melting point of said first alloy layer, thereby joining said electronic parts on said board.

2. The lead-free solder joining method according to claim 1, wherein some of said first alloy layer remains at a joining portion of said first and second alloy layers after contacting and heating.

3. The lead-free solder joining method according to claim 1, wherein said first alloy layer contains Sn as a main component and at least Ag, and said second alloy layer contains Sn as a main component thereof and at least Bi.

4. An electronic module fabricated by the lead-free solder joining method according to claim 1.

5. The solder joining method of claim 1, wherein the first alloy layer is formed on the electronic part at a temperature lower than the melting point of the first alloy layer.

* * * * *